United States Patent
Kugimiya et al.

(10) Patent No.: US 9,817,318 B2
(45) Date of Patent: Nov. 14, 2017

(54) MASK MANUFACTURING EQUIPMENT AND MASK MANUFACTURING METHOD

(71) Applicant: Toshiba Memory Corporation, Minato-ku (JP)

(72) Inventors: Tetsuya Kugimiya, Kawasaki (JP); Kazuya Fukuhara, Suginami (JP); Hidenori Sato, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/645,842

(22) Filed: Mar. 12, 2015

(65) Prior Publication Data
US 2015/0268562 A1    Sep. 24, 2015

(30) Foreign Application Priority Data
Mar. 19, 2014    (JP) .................................. 2014-055941

(51) Int. Cl.
G03F 7/20    (2006.01)
G03F 1/00    (2012.01)
(Continued)

(52) U.S. Cl.
CPC ............ *G03F 7/70191* (2013.01); *G03F 1/00* (2013.01); *G03F 1/72* (2013.01); *G03F 1/82* (2013.01); *G03F 1/84* (2013.01)

(58) Field of Classification Search
CPC ........... G03F 7/70; G03F 7/70191; G03F 1/50
(Continued)

(56) References Cited

U.S. PATENT DOCUMENTS

| 8,097,539 B2 | 1/2012 | Itoh |
| 8,502,171 B2 | 8/2013 | Itoh |

(Continued)

FOREIGN PATENT DOCUMENTS

| EP | 2 209 046 A1 | 7/2010 |
| JP | 2009-170458 A | 7/2009 |

(Continued)

OTHER PUBLICATIONS

Extended European Search Report dated Nov. 9, 2015 in Patent Application No. 15158388.7.

(Continued)

*Primary Examiner* — Stephen Rosasco
(74) *Attorney, Agent, or Firm* — Oblon, McClelland, Maier & Neustadt, L.L.P.

(57) ABSTRACT

According to an embodiment, mask manufacturing equipment includes a detector, an irradiator, a calculator, and a controller. The detector detects positional deviation of a pattern formed on a mask substrate. The irradiator irradiates the mask substrate with laser light to form a heterogeneous layer that is expanded in volume in the mask substrate. The calculator calculates an area periphery irradiation condition under which the irradiator is caused to emit laser light to a peripheral area of the pattern on the basis of the positional deviation detected by the detector so that the pattern area is reduced by forming the heterogeneous layer in the peripheral area of the pattern. The controller controls the irradiator to form the heterogeneous layer in the peripheral area of the pattern according to the area periphery irradiation condition.

6 Claims, 6 Drawing Sheets

(51) Int. Cl.
    *G03F 1/82* (2012.01)
    *G03F 1/72* (2012.01)
    *G03F 1/84* (2012.01)

(58) Field of Classification Search
    USPC .......................................... 430/5; 250/492.2
    See application file for complete search history.

(56) References Cited

U.S. PATENT DOCUMENTS

| | | |
|---|---|---|
| 8,539,394 B2 | 9/2013 | Pforr |
| 8,653,483 B2 | 2/2014 | Itoh |
| 8,658,537 B2 | 2/2014 | Itoh |
| 2008/0032206 A1 | 2/2008 | Lee et al. |
| 2010/0003830 A1 | 1/2010 | Itoh |
| 2011/0079350 A1* | 4/2011 | Lee .................. B23K 26/0661 156/272.8 |
| 2012/0009511 A1 | 1/2012 | Dmitriev |
| 2012/0084044 A1 | 4/2012 | Dmitriev |
| 2012/0091370 A1 | 4/2012 | Itoh |
| 2012/0154773 A1 | 6/2012 | Beyer |
| 2012/0227014 A1 | 9/2012 | Pforr |
| 2013/0153791 A1 | 6/2013 | Itoh |
| 2013/0157473 A1 | 6/2013 | Itoh |

FOREIGN PATENT DOCUMENTS

| | | |
|---|---|---|
| JP | 2010-152031 A | 7/2010 |
| JP | 2012-22323 A | 2/2012 |
| JP | 4909913 B2 | 4/2012 |
| JP | 2012-88712 A | 5/2012 |
| JP | 2012-222355 A | 11/2012 |

OTHER PUBLICATIONS

Avi Cohen, et al., "Correcting Image Placement Errors Using Registration Control (RegC) Technology in the Photomask Periphery" Proceedings of SPIE, vol. 8522, XP055224456, Nov. 8, 2012, 9 Pages.

* cited by examiner

MASK MANUFACTURING EQUIPMENT AND MASK MANUFACTURING METHOD

CROSS-REFERENCE TO RELATED APPLICATION(S)

This application is based upon and claims the benefit of priority from Japanese Patent Application No. 2014-055941, filed on Mar. 19, 2014; the entire contents of which are incorporated herein by reference.

FIELD

An embodiment described herein relates generally to mask manufacturing equipment and a mask manufacturing method.

BACKGROUND

In recent years, with the progress in miniaturization of semiconductor devices, problems in photolithography processes that are pattern drawing processes used in processes of manufacturing semiconductor devices are getting more and more significant. As the pattern width becomes smaller, resolving power resulting from pattern transfer using light is becoming insufficient, and nano-imprint technologies are increasingly used in place of pattern transfer using light.

The imprint technologies are technologies of pressing an imprint mask with a pattern formed thereon onto an imprint material applied to a wafer substrate, and hardening the imprint material, whereby the pattern formed on the imprint mask is transferred onto the wafer substrate to form the pattern thereon.

In manufacturing of semiconductor devices using the photolithography technologies and the imprint technologies, a pattern that is the same as or different from a pattern preformed on a wafer substrate needs to be formed on the preformed pattern. In the series of pattern forming processes, high-accuracy registration between the patterns is required.

Patterns formed on a photolithographic mask and an imprint mask, however, each have deviation from the design position, and the deviations from the design positions need to be corrected in order to meet the requirement of high-accuracy registration.

To meet such a requirement, in a photolithography process, positional deviation of a pattern formed on a mask substrate can typically be resolved up to a one-dimensional component thereof corresponding to enlargement/reduction or up to two or three components thereof by a lens optical system for projection in a reduced size on the wafer substrate. Furthermore, in an imprint process, correction of a one-dimensional component corresponding to reduction can be carried out by pressing an end face of an imprint mask. With both of photolithography and imprint, however, there are positional deviations of higher dimension that cannot be completely corrected by the correction method mentioned above.

To correct such positional deviation of higher dimension, a technology of irradiating a mask substrate with laser light to form a heterogeneous layer that expands in volume more greatly than a peripheral area thereof in the mask substrate so that the mask substrate itself is changed in shape and the positional deviation is thus corrected, for example, is starting to be used. It is expected that correction of positional deviation of higher dimension will be carried out by forming a heterogeneous layer that expands greatly in a specific direction depending on a laser light irradiation condition in a mask substrate, for example.

Since, however, volume expansion is dominant for a heterogeneous layer in a mask substrate formed as a result of irradiation with laser light, irradiation of a pattern with laser light to correct positional deviation of higher dimension tends to result in enlargement of the pattern area drawn on a photolithographic mask or an imprint mask. Furthermore, there are problems that positional deviation of high dimension in a pattern area cannot be corrected and that the size of the entire pattern area cannot be adjusted to a desired size if the effect of reducing a pattern as a result of enlarging/reducing a photolithographic mask by an optical system or pressing a side face of an imprint mask as described above is unlikely.

DETAILED DESCRIPTION

According to an embodiment, mask manufacturing equipment includes a detector, an irradiator, a calculator, and a controller. The detector detects positional deviation of a pattern formed on a mask substrate. The irradiator irradiates the mask substrate with laser light to form a heterogeneous layer that is expanded in volume in the mask substrate. The calculator calculates an area periphery irradiation condition under which the irradiator is caused to emit laser light to a peripheral area of the pattern on the basis of the positional deviation detected by the detector so that the pattern area is reduced by forming the heterogeneous layer in the peripheral area of the pattern. The controller controls the irradiator to form the heterogeneous layer in the peripheral area of the pattern according to the area periphery irradiation condition.

Mask manufacturing equipment (imprint mask manufacturing equipment) according to an embodiment will be described below with reference to the accompanying drawings.

Embodiment

Figure 1:
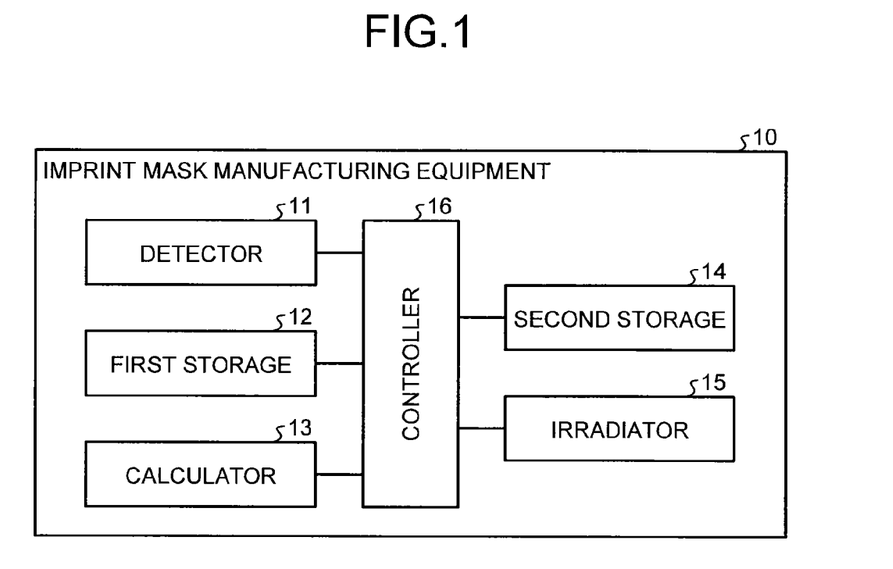
FIG. 1 is a functional block diagram illustrating functions of mask manufacturing equipment according to an embodiment.

FIG. 1 is a functional block diagram illustrating an outline of functions of mask manufacturing equipment (imprint mask manufacturing equipment) 10 according to the embodiment. The mask manufacturing equipment 10 is not limited to manufacture of imprint masks but may be equipment for manufacturing photolithographic masks or the like, for example. The mask manufacturing equipment 10 also has functions as a computer including a CPU, a storage device, a communication interface, and the like, for example.

As illustrated in FIG. 1, the mask manufacturing equipment 10 includes a detector 11, a first storage 12, a calculator 13, a second storage 14, an irradiator 15, and a controller 16, for example.

The detector (positional deviation detector) 11 detects positional deviation (positional deviation information) of a predetermined position on a mask substrate from an ideal position in a reference pattern actually formed on the mask substrate, and calculates a pattern position change ratio indicating the proportion of the positional deviation to the distance between adjacent ideal reference patterns. Note that, in the present embodiment, the predetermined position on the mask substrate is within the area of the reference pattern formed on the mask substrate.

The pattern position change ratio calculated by the detector 11 is stored in association with the pattern area in the second storage 14. Note that a reference pattern refers to a pattern provided to detect positional deviation (positional distortion) of a pattern formed on a mask substrate for producing a semiconductor device, that is a pattern defined to be formed at predetermined intervals according to the design. Positional deviation can be detected by a laser interferometer or the like.

Although a reference pattern formed on a mask substrate is used to detect positional deviation of a pattern on the mask substrate in the example described above, positional deviation of a mask pattern for forming a normal device pattern of a semiconductor substrate formed on a mask substrate may be detected without using a reference pattern on the mask substrate. Specifically, positional deviation from an ideal position in a pattern for forming a device pattern formed on a mask substrate may be detected.

The first storage (positional deviation correction information storage) 12 stores positional deviation correction information indicating the relation between the amount and the position of laser irradiation to a mask substrate and the amount (ratio) of change of a pattern position resulting from laser irradiation. The positional deviation correction information varies depending on the wavelength, the power, the beam diameter, and the beam length of laser light for irradiation, the material for the mask substrate, and the like, and is obtained in advance through experiment. In the present embodiment, the number of applied laser pulses is used for the laser irradiation amount.

The positional deviation correction information is obtained as a proportion of change of a position on a side of a predetermined square area (an area of 10 mm square, for example) near the center of the thickness of the mask substrate when a predetermined number of laser pulses are applied to the square area, for example. The density of laser pulse irradiation and the pattern position change ratio are highly correlated with each other: the pattern position change ratio is smaller as the density of laser pulse irradiation is lower, and the pattern position change ratio is larger as the density of laser pulse irradiation is higher. Thus, if the amount of deviation of the actual pattern position from the ideal pattern position is known, the density of laser pulse irradiation for correcting the amount of deviation can be obtained from the positional deviation correction information.

Although the relation between the density of laser pulse irradiation and the proportion of change of position when the irradiation position is near the center of the thickness of the mask substrate is used as the positional deviation correction information in this example, the relation between the irradiation position in the thickness direction of the mask substrate and the amount (ratio) of change in the position may be used. The positional deviation correction information in this case is obtained as an amount (proportion) of change of a position on a side of a predetermined square area (an area of 10 mm square, for example) when a predetermined amount of laser pulses is applied to positions in the thickness direction of the square area, for example. Furthermore, the positional deviation correction information may be obtained by using the relation between the irradiation position in the horizontal direction of the mask substrate and the amount (ratio) of change in position in addition to the relation between the irradiation position in the thickness direction of the mask substrate and the amount (ratio) of change in position.

The calculator (laser irradiation condition calculator) 13 obtains the laser pulse irradiation condition for resolving the positional deviation, such as the density of laser pulse irradiation, from the pattern position change amount (ratio) in the pattern area by using the positional deviation correction information, and multiplies the density of laser pulse irradiation by the area of each pattern area to calculate the number of laser pulses to be applied in each pattern area to be corrected. Each laser irradiation condition calculated by the calculator 13 includes condition for setting the laser irradiation amount of laser light to be emitted by the irradiator 15, the laser irradiation position, the direction of expansion of the heterogeneous layer, etc. The calculator 13 also calculates an area periphery irradiation condition under which the irradiator 15 is caused to apply laser light to a periphery of the pattern area on the basis of the positional deviation detected by the detector 11 so that the pattern area is reduced by forming a heterogeneous layer in the periphery of the pattern area, as will be described later. The laser irradiation condition such as the number of laser pulses to be applied is stored in association with each pattern area in the second storage 14.

When the pattern position change ratios in the x-axis direction and in the y-axis direction in a pattern area are different from each other, calculation of the amount of laser irradiation is carried out by using a pattern position change ratio that is a negative value (indicating a change in the direction in which the distance between adjacent patterns decreases) whose absolute value is larger.

The second storage (positional deviation information storage) 14 stores the pattern position change amount (ratio) detected by the detector 11 and the laser irradiation condition for each pattern area on the substrate calculated by the calculator 13 in association with the pattern area on the mask substrate as the positional deviation information. Note that the pattern position change ratio stored in the second storage 14 needs to be the pattern position change ratio of a mask pattern for forming a device pattern formed on the mask substrate, but may be a pattern position change ratio calculated by using a reference pattern instead of the mask pattern for forming the device pattern as presented in this example. Furthermore, the laser irradiation condition in the positional deviation information includes the irradiation position that is a position of a mask substrate irradiated with laser and the amount of laser irradiation to the position. The irradiation position is stored in the second storage 14 as such a position as deviated from the center of the device pattern by a predetermined distance in the thickness direction or the horizontal direction of the mask substrate, for example.

The irradiator (laser irradiator) 15 applies laser light of a predetermined number of pulses to each position (in a pattern area) on the mask substrate on the basis of the laser irradiation condition in each pattern area stored in the second storage 14. The irradiator 15 has a substrate holding function of holding a mask substrate, a laser light source that emits laser light to the substrate, and a registration function for emitting laser light to a position on the mask substrate included in the positional deviation information. The laser light source used herein is an infrared laser light source that outputs infrared laser such as YAG (Yttrium Aluminum Garnet) laser or carbon dioxide laser in a pulsed manner. The laser light source can also be set so that laser light will be focused on a predetermined position (near the center, for example) in the thickness direction of the substrate.

The controller 16 controls the respective components of the mask manufacturing equipment 10. In particular, the controller 16 controls the irradiator 15 so that the irradiator 15 forms a heterogeneous layer in a pattern area and in a periphery of the area according to an area irradiation condition and the area periphery irradiation condition, as will be described later.

With the mask manufacturing equipment 10 having such a configuration, laser light of the number of laser pulses according to the pattern position change ratio at each position of the mask substrate to be corrected (a position defined by a Cartesian coordinate system with the origin at the center of a mask pattern for forming a device pattern, for example) is applied to a predetermined depth (about the center of the thickness, for example) from the surface of the mask substrate at the position. At the position irradiated with laser light, the temperature instantly rises, fusion is carried out for a very short time and then cooling is immediately carried out, whereby a heterogeneous layer that is slightly larger in volume than the surrounding area is formed. Since the heterogeneous layer is expanded as compared to the surrounding area of the mask substrate, the patterns are changed in position with the expansion, which can bring the actual positions of the pattern to the ideal positions. In this manner, even an imprint mask that has complex positional distortion of two- or higher dimensional components, the pattern position can be brought closer to the ideal pattern position.

Figure 2:
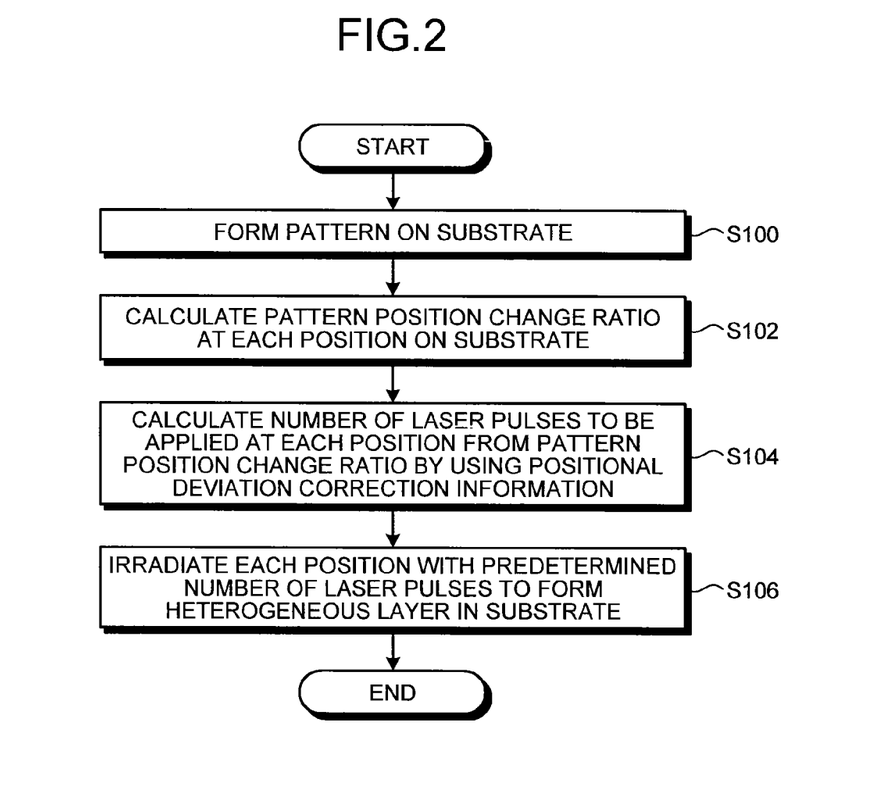
FIG. 2 is a flowchart illustrating a mask manufacturing method according to the embodiment.

Next, a method for manufacturing an imprint mask will be described. FIG. 2 is a flowchart illustrating a mask manufacturing method according to the embodiment. First, a resist layer is formed on the entire surface of a mask substrate such as a quartz substrate, and a resist pattern (a gate layer pattern for forming a gate layer of a memory device having a half pitch of 22 nm, for example) is formed through an exposure process of performing irradiation with electron rays or X rays in a predetermined size and in a predetermined shape and a development process. In this example, the patterns formed on the mask substrate include a reference pattern for detecting positional deviation of a pattern on the mask substrate, the reference pattern being formed into a grid-like pattern, for example. The reference pattern, however, is not necessarily needed, and a pattern for forming a device pattern to be formed on the mask substrate may be used in place of the reference pattern. After etching of the mask substrate is carried out using the resist pattern as a mask, the resist pattern is removed, and a pattern is thus formed on the mask substrate (step S100). The mask substrate on which the pattern is formed will also be hereinafter referred to as an imprint mask. In this example, it is assumed that the imprint mask is formed by processing a quartz substrate having a thickness of about 6 mm.

Typically, when a pattern is formed on the mask substrate, positional deviation (positional distortion) of the position of the formed pattern from an ideal position is caused owing to influence of stress from a resist (alternatively, a film used as a mask may be formed instead of a resist) formed on the mask substrate or owing to limitations of the drawing accuracy of a drawing device in the exposure process.

Subsequently, the detector 11 measures positional deviation from the ideal position of the pattern formed into a grid on the mask substrate, and calculates the pattern position change ratio indicating the degree of deviation of the actual pattern position from the ideal pattern position at each position on the mask substrate (step S102). The measurement of the pattern position change ratio is obtained for each square pattern area surrounded by four patterns, for example. The obtained pattern position change ratio is stored in association with the pattern area in the second storage 14.

Thereafter, the calculator 13 acquires laser pulse irradiation density information, irradiation position information, etc., in each pattern area on the mask substrate from the pattern change amount of the pattern area on the basis of positional deviation correction information stored in the first storage 12. The calculator 13 multiplies the area of the pattern area by the acquired density of laser pulse irradiation to calculate the number of laser pulses to be applied to the pattern area (step S104).

Subsequently, the irradiator 15 applies laser pulses to each pattern area on the substrate on the basis of the number of pulses to be applied, etc. calculated by the calculator 13 to form a heterogeneous layer that is increased in volume as compared to the surrounding mask substrate material near the center, for example, of the thickness of the imprint mask (mask substrate) (step S106).

Next, a method for manufacturing a semiconductor device using such an imprint mask will be described. Herein, an example in which a pattern of an area in which resolving power will be insufficient if photolithography is used, for example, is formed on a film to be processed (production of a memory device, for example) by using the imprint mask will be described.

A coating material is applied to the entire surface of the film to be processed formed on a semiconductor substrate for producing a semiconductor device, the imprint mask formed through the manufacturing processes described above is placed in a manner that the pattern formed surface of the imprint mask is opposed to the coating material, and the imprint mask and the substrate are brought closer to each other. Subsequently, registration between the imprint mask and the semiconductor substrate is carried out, the imprint mask is then pressed against the substrate with the coating material therebetween to deform the coating material, the coating material is hardened by heat or light, and as a result, the pattern on the imprint mask is transferred to the coating material. After the coating material is sufficiently hardened, the imprint mask is separated from the substrate and the remaining coating material is etched. As a result, the coating material pattern is formed on the film to be processed on the substrate. The film to be processed is then processed by etching using the coating material pattern as a mask, and a semiconductor device having desired size and shape is thus produced.

Manufacture of memory devices by using the imprint mask produced in this manner significantly improves the alignment accuracy as compared to imprint masks of the related art and also dramatically improves the manufacturing yield of memory devices.

Although an example in which the substrate is irradiated with laser for forming the heterogeneous layer is presented in the description above, gallium ions or the like may alternatively be implanted in the substrate. In this case, the amount of implanted ions is changed according to the pattern position change ratio. The positional distortion of a pattern on an imprint mask can also be resolved by the ion implantation similarly to the laser irradiation.

Figure 3A:
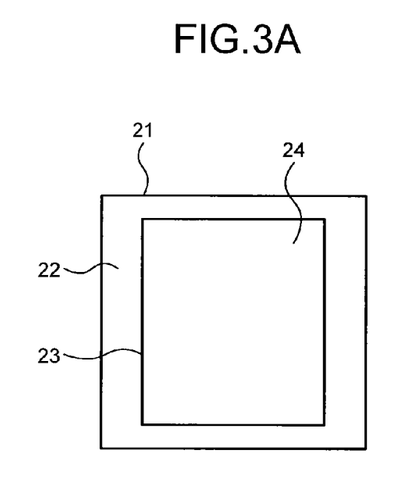
FIGS. 3A and 3B are diagrams schematically illustrating a photolithographic mask and an imprint mask, respectively.
Figure 3B:
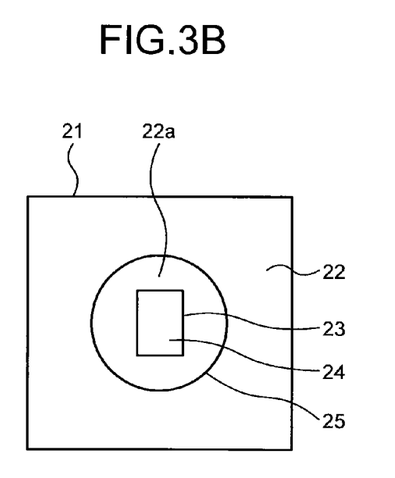

Next a method for correcting positional deviation in a pattern area will be described in more detail. FIGS. 3A and 3B are diagrams schematically illustrating a photolithographic mask and an imprint mask, respectively. The photolithographic mask illustrated in FIG. 3A is separated into a pattern area 24 and a periphery 22 of the pattern area by a boundary 23 inside of outer sides 21 of a mask substrate. The imprint mask illustrated in FIG. 3B is provided with an area 22a inside of a boundary 25 where the thickness of the mask substrate changes and having a thickness different from that of a periphery 22 of a pattern area inside of outer sides 21 of the mask substrate. Furthermore, the area 22a includes therein a pattern area 24 defined by a boundary 23. The thickness of the area 22a may not be different from that of the mask substrate.

In the processes of manufacturing the semiconductor device, positional deviation (deviation amount) when a new pattern is formed on a pattern formed in advance on a wafer substrate is measured at a measurement point located at a point corresponding to inside of the pattern area 24. The positional deviation contains high-dimensional components.

For correcting high-dimensional deviation through irradiation with laser light, the correction is realized by obtaining the amount of laser irradiation to each position inside of the outer sides 21 of the mask substrate, and carrying out irradiation with laser light according to the irradiation amount to cause desired volume expansion at each position so that the mask substrate is deformed.

The formation of the heterogeneous layer through irradiation with laser light essentially results in expansion of volume. When laser light is applied, the pattern area 24 is thus deformed in an enlarged manner. The mask manufacturing equipment 10 therefore irradiates the periphery 22 of the pattern area with laser light so that the entire pattern area 24 is reduced to form a heterogeneous layer in the mask substrate.

When the positional deviation amount at a point with positional deviation remaining in the pattern area 24 after laser light irradiation is represented by (δx, δy), for example, the positional deviation amount can further be corrected by adjusting the values of up to three-dimensional imaging conversion parameters ($\alpha_{ij}$, $\beta_{ij}$) expressed by the following expression (1). The positional deviation amount after correction through imaging conversion by laser light irradiation is expressed by (δx', δy').

$$\begin{cases} \delta x' = \delta x + \sum_{i=0}^{3} \sum_{j=0}^{3} \alpha_{ij} x^j y^i \\ \delta y' = \delta y + \sum_{i=0}^{3} \sum_{j=0}^{3} \beta_{ij} x^j y^i \end{cases} \quad (1)$$

The positional deviation amount can also be corrected by optical correction according to photolithography or applying a mechanical force to a mask side face according to imprint. Since, however, the correction amount is limited, it is desired that the correction amount be reduced or made to be unnecessary by laser light irradiation.

An effective parameter among up to three-dimensional imaging conversion parameters ($\alpha_{ij}$, $\beta_{ij}$) is selected by an imaging conversion correction device. The mask manufacturing equipment 10 minimizes a function for minimizing the difference in the positional deviation amount in the pattern area 24 between before and after the correction and a function for minimizing the value of an effective imaging conversion parameter ($\alpha_{ij}$, $\beta_{ij}$) in the pattern area 24 that are objective functions at the same time, to reduce or eliminate the need of further correction of the positional deviation amount after correction through laser light irradiation.

Figure 4:
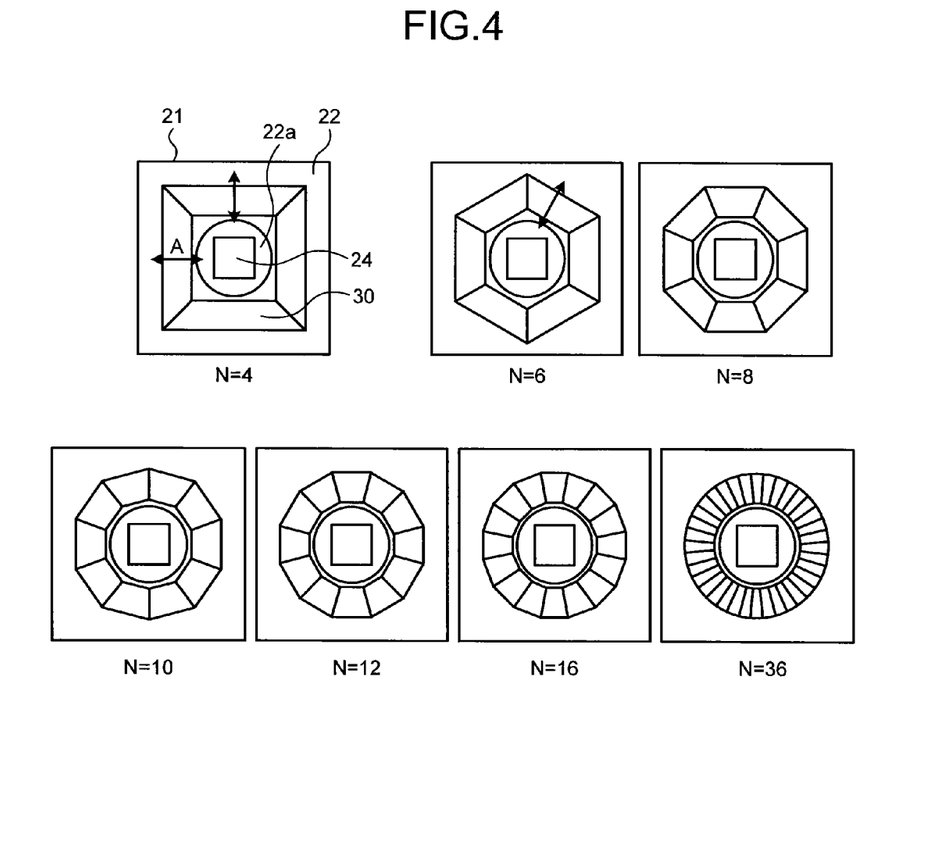
FIG. 4 illustrates directions in which a heterogeneous layer formed in a periphery of a pattern area expands.

FIG. 4 illustrates directions in which a heterogeneous layer formed in the periphery 22 of the pattern area of the imprint mask by the mask manufacturing equipment 10 expands. To reduce the pattern area 24 (or the area 22a), the mask manufacturing equipment 10 provides multiple quadrangular areas 30 in the periphery 22 of the pattern area in a manner that the pattern area 24 (or the area 22a) is surrounded. The outer shape of the quadrangular areas 30 is a polygonal shape (an N-sided polygon: N=4 to 36, for example).

Each quadrangular area 30 is irradiated with laser light so that the quadrangular area 30 expands greatly along a line connecting a point that is substantially the center of the mask substrate and a point that is substantially the center of the quadrangular area 30 as indicated by an arrow A in FIG. 4. When each of the quadrangular areas 30 expands greatly along a line connecting a point that is substantially the center of the mask substrate and a point that is substantially the center of the quadrangular area 30 in this manner, the pattern area 24 (or the area 22a) is reduced (compressed) as will be described later with reference to part (a) of FIG. 5.

In contrast, when the heterogeneous layer formed in each quadrangular area 30 expands uniformly in all directions, (the expansion of the heterogeneous layer is non-directional: concentric expansion, for example), the pattern area 24 (or the area 22a) is deformed in an enlarging direction as will be described later with reference to part (b) of FIG. 5.

Thus, the calculator 13 calculates the area periphery irradiation condition so that the heterogeneous layer formed in each of multiple quadrangular areas 30 (partitioned areas) surrounding the pattern area 24 expands in a direction along a line connecting the quadrangular area 30 and the center of the pattern.

Figure 5:
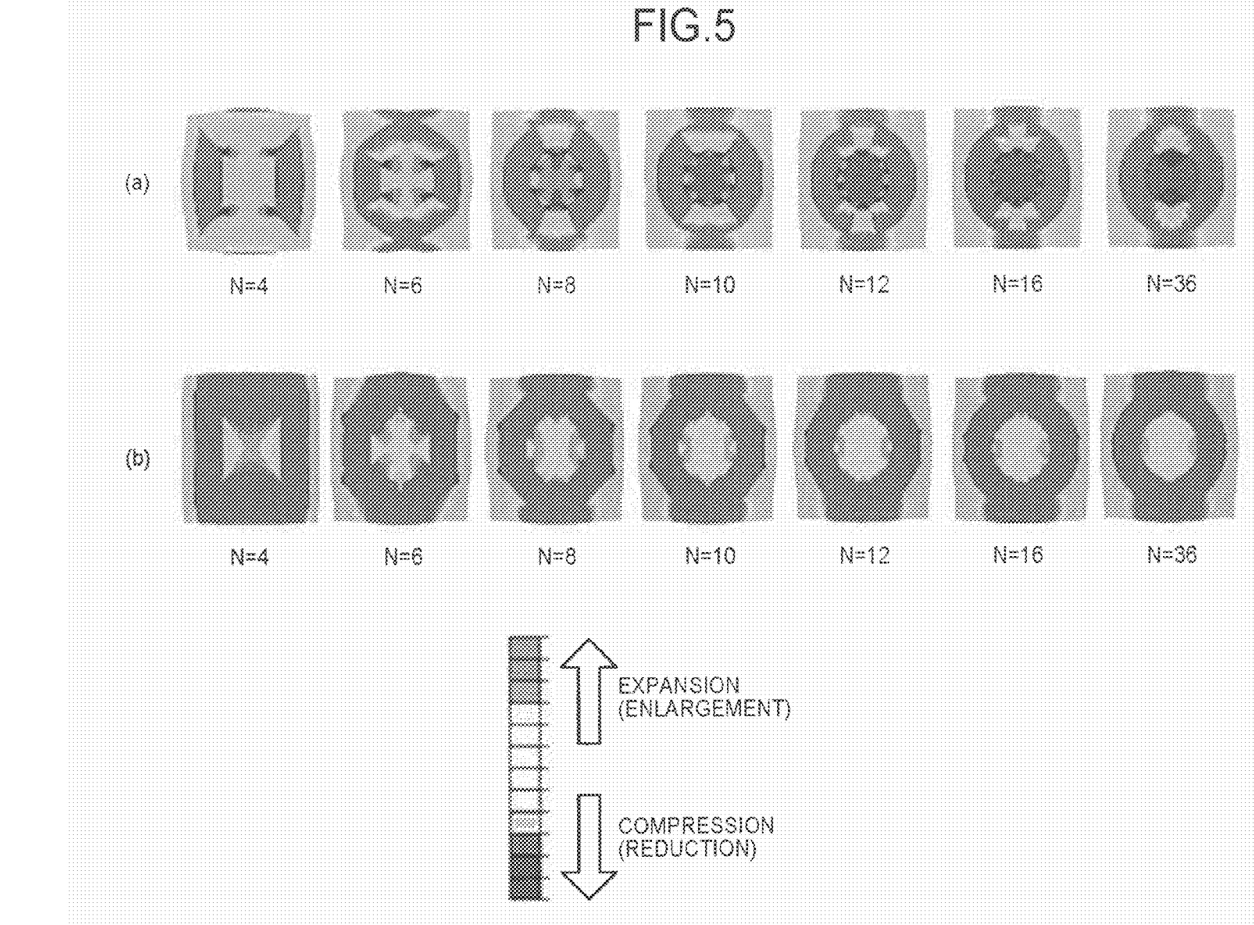
FIG. 5 illustrates an example and a comparative example of forming a heterogeneous layer in a periphery of a pattern area.

FIG. 5 illustrates a result of two-dimensional finite-element analysis according to an example and a comparative example, in which a heterogeneous layer is formed in the periphery 22 of the pattern area in FIG. 4. The contour in FIG. 5 represents the size of distortion in the lateral direction (one direction on a plane: an X direction, for example). Note that reducing deformation in the pattern area 24 is not always uniform (that is, only a one-dimensional component) reducing deformation but contains higher-dimensional components depending on the arrangement of the quadrangular areas 30 and the amount of laser light irradiation.

In the example illustrated in part (a) of FIG. 5, laser light is applied so that each quadrangular area 30 expands greatly along a line connecting a point that is substantially the center of the mask substrate and a point that is substantially the center of the quadrangular area 30 as illustrated in FIG. 4. In part (a) of FIG. 5, each quadrangular area 30 expands so that the area 22a is compressed (reduced). In contrast, in the comparative example illustrated in part (b) of FIG. 5, laser light is applied so that the heterogeneous layer formed in each quadrangular area 30 uniformly expands in all directions. In part (b) of FIG. 5, each quadrangular area 30 expands so that the area 22a is expanded (enlarged). Thus, whether or not the area 22a is reduced is set depending on the directions in which the quadrangular areas 30 expand.

Furthermore, as illustrated in part (a) of FIG. 5, as the number N of the quadrangular areas 30 (the number N of partitions) is larger, the effect of reducing the area 22a tends to be greater and the reduction of the area 22a tends to be more uniform.

Figure 6:
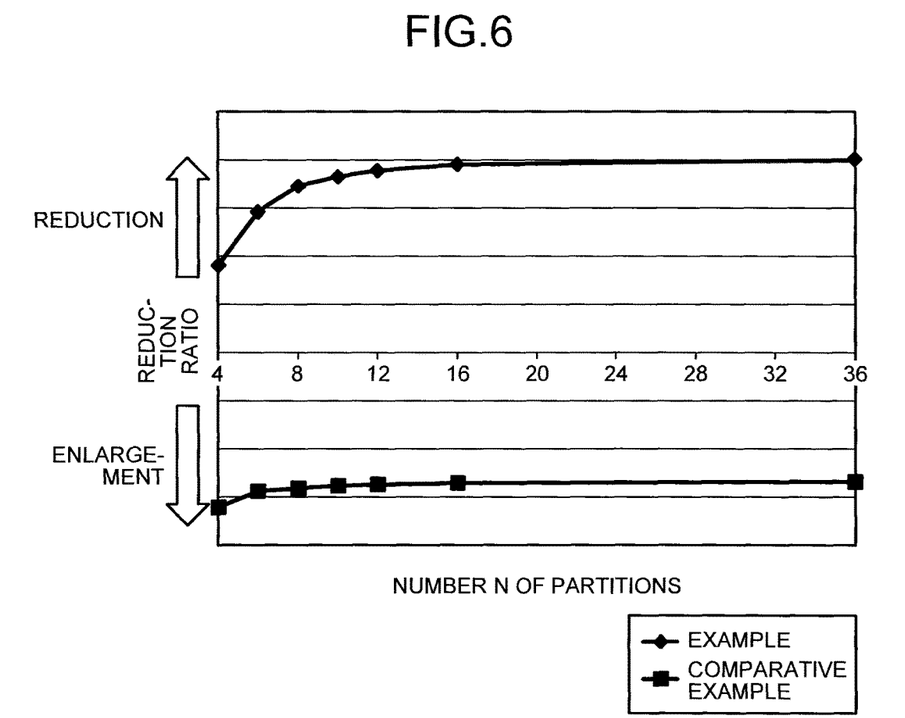
FIG. 6 is a graph illustrating a relation between the number of quadrangular areas and a reduction ratio of an area (pattern area)

FIG. 6 is a graph illustrating a relation between the number N of quadrangular areas 30 and a reduction ratio of the area 22a (pattern area 24). As the number N of quadrangular areas 30 is increased, the effect of reduction of the area 22a is increased but converges at about N=16, and the effect is no longer increased even if the number N is further increased.

Furthermore, the mask manufacturing equipment 10 forms the heterogeneous layer in the periphery 22 of the pattern area (area 22a) to produce the effect of reduction of the pattern area 24, which can be produced even when the number N of quadrangular areas 30 (the number N of partitions) is small. Furthermore, the mask manufacturing equipment 10 may form the heterogeneous layer by applying laser light that expands greatly along a line connecting a certain point in the periphery 22 of the pattern area and a point that is substantially the center of the mask substrate.

Figure 7:
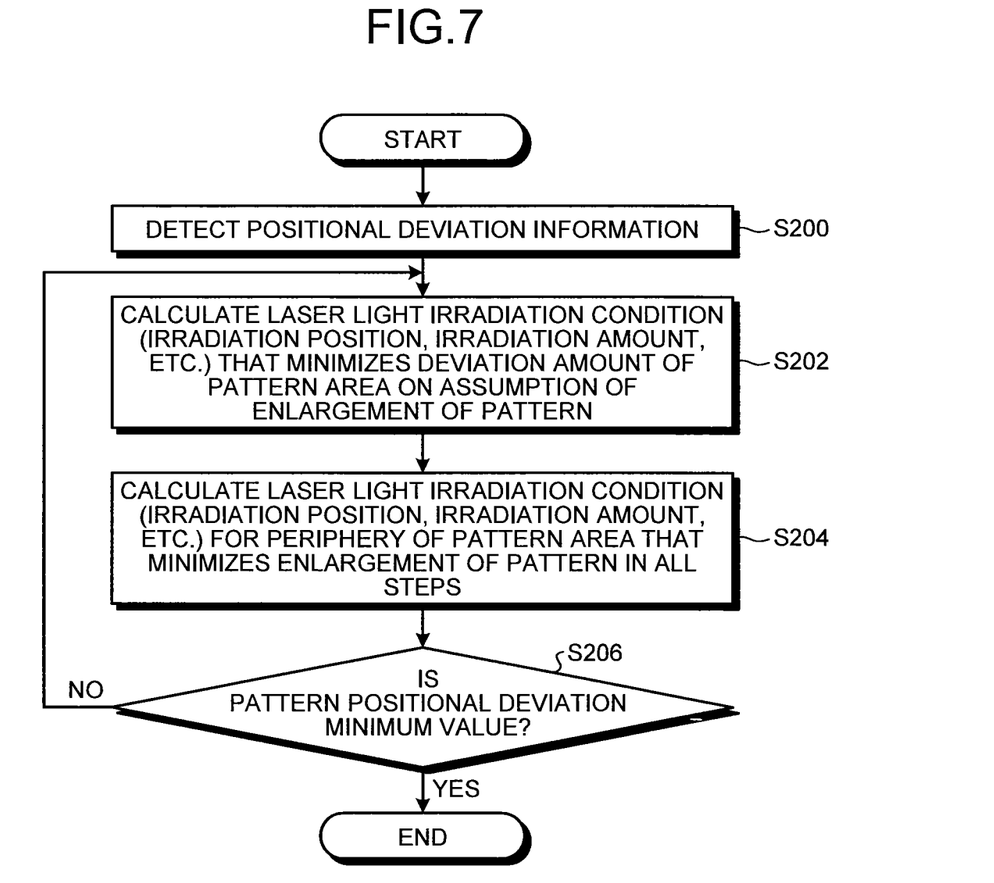
FIG. 7 is a flowchart illustrating a process of calculating an irradiation condition for a periphery of a pattern area.

Next, a process of calculating an irradiation condition (irradiation position, irradiation amount, etc.) of laser light to be applied to the periphery 22 of the pattern area will be described in detail. FIG. 7 is a flowchart illustrating a process of calculating an irradiation condition of laser light to be applied to the periphery 22 of the pattern area.

In step 200 (S200), the detector 11 detects positional deviation information of the pattern area 24.

In step 202 (S202), the calculator 13 calculates the irradiation condition (irradiation position, irradiation amount, etc.) for laser light that minimizes the positional deviation (positional deviation amount) of the pattern area 24 on the assumption of enlargement of the pattern.

In step 204 (S204), the calculator 13 calculates the irradiation condition (irradiation position, irradiation amount, etc.) for laser light to be applied to the periphery 22 of the pattern area that minimizes enlargement of the pattern (each pattern) in all the steps.

In step 206 (S206), the controller 16 determines whether or not the pattern positional deviation has become a minimum value. If the controller 16 determines that the pattern positional deviation has not become the minimum value (S206: No), the process returns to the processing of S202. If the controller 16 determines that the pattern positional deviation has become the minimum value (S206: Yes), the process is terminated.

As described above, the calculator 13 calculates the area irradiation condition under which the irradiator 15 is caused to emit laser light so that the positional deviation detected by the detector 11 will be minimized by forming a heterogeneous layer in the pattern area 24, and calculates the area periphery irradiation condition for the periphery 22 of the pattern area so that unnecessary expansion of the mask substrate when the irradiator 15 emits laser light according to the area irradiation condition will be minimized. Specifically, the calculator 13 calculates the irradiation condition for minimizing the positional deviation under a condition allowing enlargement of the pattern area 24 in the processing of S202, and calculates the irradiation condition for the periphery 22 of the pattern area for canceling or minimizing unnecessary enlargement (reverse deformation) in the processing of S204. The irradiation conditions maybe expressed by objective functions for optimizing the positional deviation amount.

Specifically, the mask manufacturing equipment 10 allows correction of a pattern formed on a mask substrate through the processing in S202 and S204 without carrying out correction using an optical system and mechanical correction.

Furthermore, the mask manufacturing equipment 10 may be configured to calculate the irradiation conditions for the pattern area 24 and the periphery 22 of the pattern area at the same time, and carry out laser light irradiation to the pattern area 24 and the periphery 22 of the pattern area at the same time.

Figure 8A:
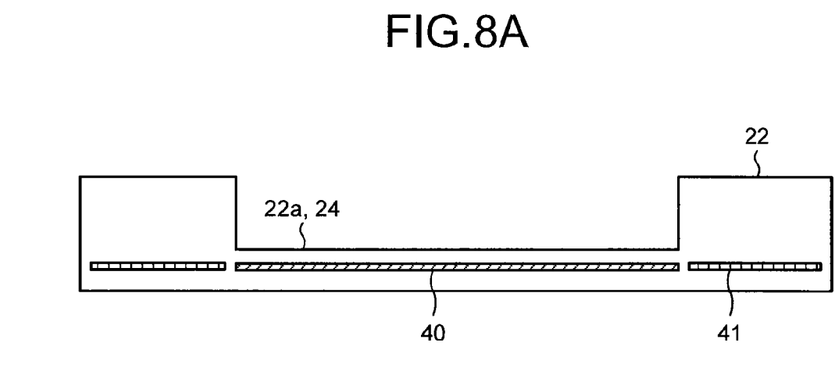
FIGS. 8A and 8B are cross-sectional views schematically illustrating the comparative example and the example of forming a heterogeneous layer, respectively.
Figure 8B:
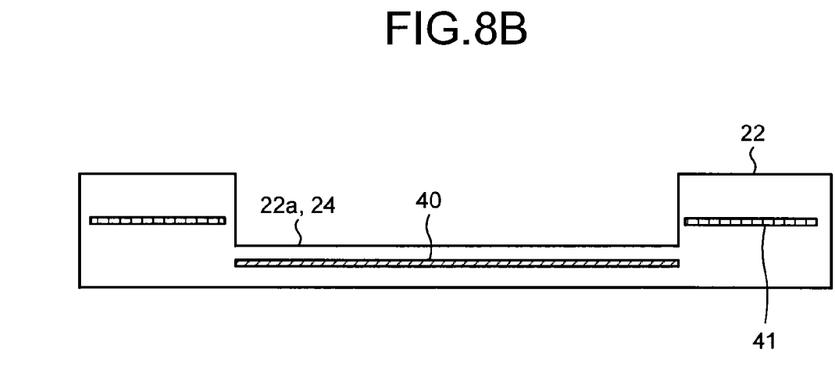

Next, the position in the thickness direction where the heterogeneous layer is formed in the imprint mask will be described. FIGS. 8A and 8B are cross-sectional views schematically illustrating the comparative example and the example, respectively, of forming a heterogeneous layer in an imprint mask substrate (see FIG. 3B).

As illustrated in FIG. 8A, if heterogeneous layers 40 and 41 are formed at the same position in the thickness direction of the imprint mask substrate in the periphery 22 of the pattern area, the area 22a, and the pattern area 24, the imprint mask substrate may be warped and deformed. Specifically, since volume expansion is utilized to correct positional deviation, the imprint mask substrate may be warped and deformed when the heterogeneous layers are formed at positions away from the center of the thickness of the imprint mask substrate.

As illustrated in FIG. 8B, the mask manufacturing equipment 10 forms the heterogeneous layer 40 to be formed in the area 22a and the pattern area 24 and the heterogeneous layer 41 to be formed in the periphery 22 of the pattern area at different positions in the thickness direction of the imprint mask substrate. Specifically, the calculator 13 calculates the area irradiation condition and the area periphery irradiation condition to set the positions of the heterogeneous layers 40 and 41 so that the heterogeneous layer 40 to be formed in the pattern area 24 and the heterogeneous layer 41 to be formed in the periphery 22 of the pattern area will be formed at different positions in the thickness direction of the mask substrate. As illustrated in FIG. 8B, the heterogeneous layers 40 and 41 are formed near the center in the thickness direction of the imprint mask substrate so that the imprint mask substrate is prevented from warping. Note that the heterogeneous layer 40 and the heterogeneous layer 41 may have regions overlapping with each other on a plane (parallel to each other) as long as the heterogeneous layer 40 and the heterogeneous layer 41 are formed at different positions in the thickness direction of the imprint mask substrate.

As described above, since the mask manufacturing equipment 10 calculates the area periphery irradiation condition under which the irradiator 15 is caused to emit laser light to the periphery 22 of the pattern area so that the pattern area 24 is reduced by forming the heterogeneous layer in the periphery 22 of the pattern area and controls the irradiator 15 to form the heterogeneous layer in the periphery 22 of the pattern area according to the area periphery irradiation condition, a pattern formed on the mask substrate can be corrected without carrying out correction using an optical system and mechanical correction.

While a certain embodiment has been described, the embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. Mask manufacturing equipment comprising:
   a detector configured to detect positional deviation of a pattern formed on a mask substrate;
   an irradiator configured to irradiate the mask substrate with laser light to form a heterogeneous layer that is expanded in volume in the mask substrate;
   a calculator configured to calculate an area periphery irradiation condition under which the irradiator is caused to emit laser light to a peripheral area of the pattern on the basis of the positional deviation detected by the detector so that the pattern area is reduced by forming the heterogeneous layer in the peripheral area of the pattern; and
   a controller configured to control the irradiator to form the heterogeneous layer in the peripheral area of the pattern according to the area periphery irradiation condition.

2. The equipment according to claim 1, wherein
   the calculator calculates an area irradiation condition under which the irradiator is caused to emit laser light so that the positional deviation detected by the detector is minimized by forming the heterogeneous layer in the pattern area, and calculates the area periphery irradiation condition so that unnecessary expansion of the mask substrate is minimized when the irradiator emits laser light according to the area irradiation condition, and
   the controller controls the irradiator to form the heterogeneous layer in the pattern area and in the peripheral area of the pattern according to the area irradiation condition and the area periphery irradiation condition.

3. The equipment according to claim 2, wherein the calculator calculates the area irradiation condition and the area periphery irradiation condition so that a heterogeneous layer to be formed in the pattern area and a heterogeneous layer to be formed in the peripheral area of the pattern are formed at different positions in a thickness direction of the mask substrate.

4. The equipment according to claim 1, wherein the calculator calculates the area periphery irradiation condition so that a heterogeneous layer formed in each of multiple partitioned areas surrounding the pattern area expands in a direction along the partitioned area and the center of the pattern.

5. The equipment according to claim 4, wherein an outer shape of the partitioned areas is a polygon.

6. The equipment according to claim 1, wherein the area periphery irradiation condition is a condition for setting at least an irradiation position and an irradiation amount of laser light emitted by the irradiator and a direction of expansion of the heterogeneous layer.

* * * * *